(12) United States Patent
Nakamura et al.

(10) Patent No.: US 7,950,890 B2
(45) Date of Patent: May 31, 2011

(54) VACUUM ROBOT, VACUUM MOTOR FOR VACUUM ROBOT, AND PRODUCTION METHOD OF SAID VACUUM MOTOR

(75) Inventors: Takayuki Nakamura, Fukuoka (JP); Tadataka Noguchi, Fukuoka (JP); Yoshihiro Kusama, Fukuoka (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 986 days.

(21) Appl. No.: 11/756,968

(22) Filed: Jun. 1, 2007

(65) Prior Publication Data

US 2007/0280813 A1   Dec. 6, 2007

(30) Foreign Application Priority Data

Jun. 1, 2006   (JP) .................................. 2006-153738

(51) Int. Cl.
*H01L 21/677* (2006.01)
(52) U.S. Cl. ...................... 414/217; 414/411; 414/744.5
(58) Field of Classification Search .................. 414/217, 414/411, 744.5
See application file for complete search history.

(56) References Cited

U.S. PATENT DOCUMENTS

2003/0202792 A1 * 10/2003 Goshi ........................... 396/564

* cited by examiner

*Primary Examiner* — Saúl J Rodríguez
*Assistant Examiner* — Willie Berry
(74) *Attorney, Agent, or Firm* — Westerman, Hattori, Daniels & Adrian, LLP (57) ABSTRACT

A vacuum robot includes an arm portion on which a work is to be disposed under a reduced pressure environment and a motor portion for rotatably driving the arm portion, the vacuum robot being configured to transfer the work by causing a rotational movement of the arm portion by the motor portion. The motor portion comprises a rotor portion connected to the arm portion, a stator portion disposed at an external periphery of the rotor portion, a housing disposed under an atmospheric pressure environment, and a thin cylindrical can disposed in an electromagnetic gap formed between the rotor portion and the stator portion and secured to the housing so that the stator portion is air-tightly encapsulated in a space formed by the housing and the can. The space is maintained in a depressurized state by a seal.

4 Claims, 5 Drawing Sheets

VACUUM ROBOT, VACUUM MOTOR FOR VACUUM ROBOT, AND PRODUCTION METHOD OF SAID VACUUM MOTOR

This application claims priority under 35 U.S.C. §119 to Japanese Patent Application No. 2006-153738 filed on Jun. 1, 2006, the entire disclosure of which is incorporated herein by reference in its entirety.

BACKGROUND OF THE INVENTION

1. Field of the Invention

The present invention relates to a vacuum robot, a vacuum motor for use in the vacuum robot, and a production method of the vacuum robot. More specifically, some preferred embodiments of the present invention relate to a work transferring vacuum robot for transferring a work in a vacuum environment, such as, e.g., in a semiconductor production apparatus or a crystal liquid production apparatus, a vacuum motor to be preferably used for driving a work transferring arm of the work transferring vacuum robot, a production method of the vacuum motor, and a work processing method using the vacuum robot.

2. Description of the Related Art

The following description sets forth the inventor's knowledge of related art and problems therein and should not be construed as an admission of knowledge in the prior art.

In recent years, various types of semiconductor production apparatuses and liquid crystal production apparatuses have been made available. The following explanation will be directed to a recently most common wafer processing apparatus as the related art.

Figure 5:
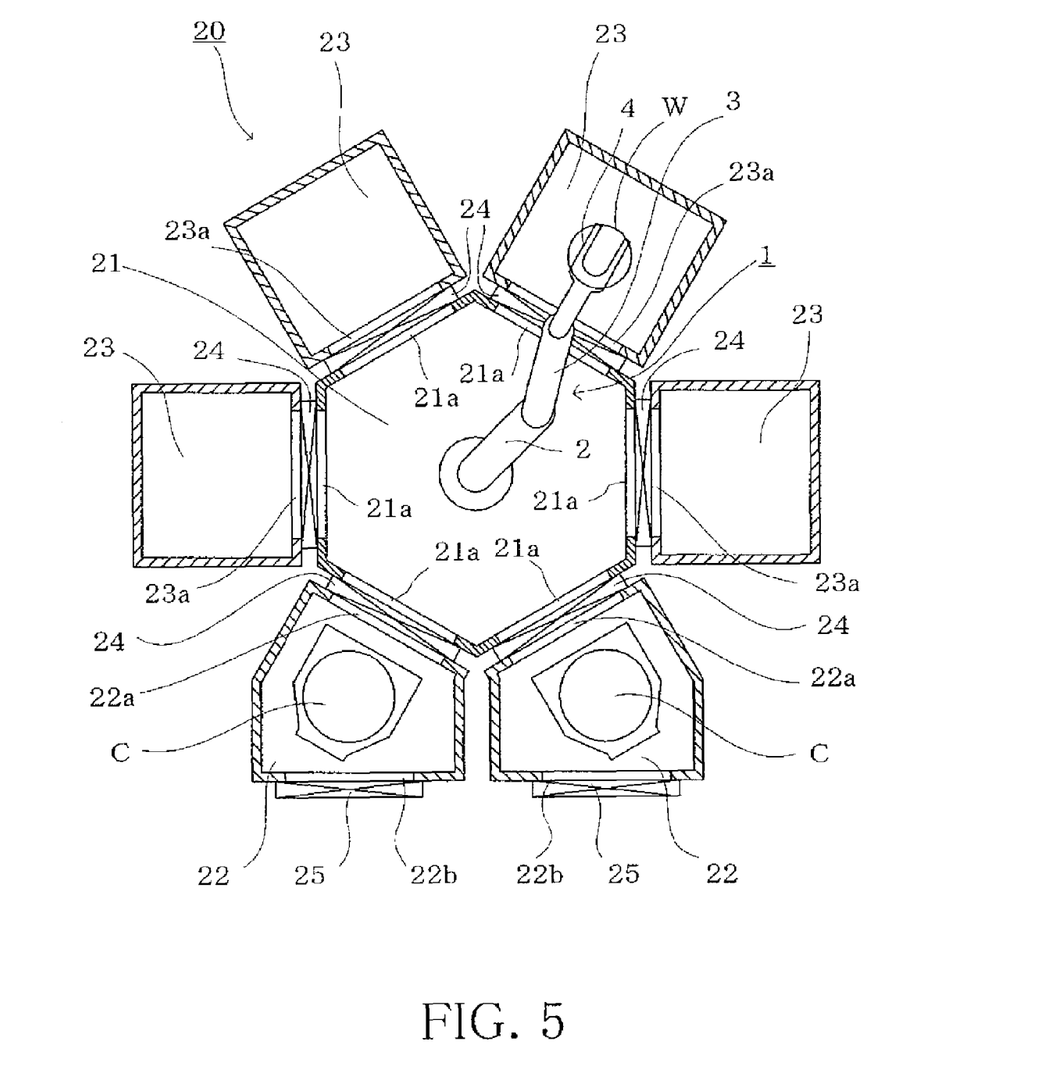
FIG. 5 is a top view showing an example of a sheet-feed articulated type wafer processing apparatus.

FIG. 5 shows a typical wafer processing apparatus. This wafer processing apparatus is provided with a wafer transferring robot disposed approximately at the center of a transferring chamber, a plurality of processing chambers surrounding the transferring chamber, and a plurality of cassette chambers. This wafer processing apparatus is a sheet-feed multi-chamber type processing apparatus capable of continuously processing wafers one by one. FIG. 5 is a top view of the wafer processing apparatus. In this figure, the reference numeral "1" denotes a horizontal articulated type wafer transferring robot, "21" denotes a transferring chamber in which the wafer transferring robot 1 is installed, "22" denotes a cassette chamber, "C" denotes a wafer cassette for storing wafers, and "23" denotes a processing chamber.

The transferring chamber 21 and each cassette chamber 22, as well as the transferring chamber 21 and each processing chamber 23, are connected by an openable and closable gate valve 24 at the connecting openings 21a, 22a and 23a each having a certain opening size. The cassette chamber 22 has another opening 22b opened toward the outside. This opening 22b is closed by an openable and closable gate valve 25. Thus, the transferring chamber 21, each processing chamber 23, and each cassette chamber 22 can be held air-tight. Normally, each processing chamber 23 is always depressurized from atmospheric pressure to low pressure (hereinafter simply referred to as "vacuum"). In the same manner as in each processing chamber 23, the transferring chamber 21 is always depressurized to certain pressure and kept in a vacuum state.

The depressurization is performed by operating a pump to discharge the inner gas in each chamber. In order to keep the pressure in the transferring chamber 21 and each processing chamber 23 under a certain pressure, normally, a pump is kept driven to discharge the inner gas. The cassette chamber 22 is repeatedly changed from a vacuum state to an atmospheric state and vice versa as needed. At the time of introducing a wafer cassette C into the cassette chamber 22 from the outside, the cassette chamber 22 is kept at approximately the same pressure as atmospheric pressure by introducing, e.g., nitrogen gas from a gas introducing apparatus (not illustrated). At the time of opening the gate valve 24 connecting the cassette chamber 22 and the transferring chamber 21, in order to attain the same vacuum state as the transferring chamber 21, the cassette chamber 22 is depressurized to approximately the same pressure as that of the transferring chamber 21 using a pump or the like.

The cassette C in the cassette chamber 22 is provided with supporting shelves arranged at certain intervals so that unprocessed and/or processed wafers W can be stored on the supporting shelves in a multistage manner.

The wafer transferring robot 1 has a plurality of robot arms 2 and 3, and a hand 4 attached at the tip end of the robot arm 3. The wafer transferring robot 1 transfers a wafer W to a desired position with the wafer W disposed on the hand 4 by rotating and/or elongating/contracting the robot arms 2 and 3 and hand 4. In detail, the wafer transferring robot 1 is configured such that, after a certain gate valve 24 is opened, the robot arms 2 and 3 are elongated to insert the hand 4 into the cassette chamber 22 or the processing chamber 23 via the connecting opening 21a, 22a or 23a to carry in/out the wafer W. Furthermore, the wafer transferring robot 1 can perform a lifting and lowering operation for placing/loading a wafer W by lifting or lowering the robot arms 2 and 3 and the hand 4, and then advancing the hand 4 with respect to the wafer cassette C in a gap between wafers W in the wafer cassette C.

Now, the processing flow of the aforementioned sheet-feed multi-chamber type wafer processing apparatus 20 will be briefly explained. Initially, the wafer W is delivered in the cassette chamber 22 as a cassette unit. After vacuuming (discharging the air) the cassette chamber 22, the gate valve 24 disposed between the transferring chamber 21 and the cassette chamber 22 will be opened and then the wafer W in the cassette C will be carried into the transferring chamber 21 by the wafer transferring robot 1. Furthermore, the gate valve 24 disposed between the transferring chamber 21 and the processing chamber 23 will be opened and then the wafer W will be loaded into the processing chamber 23 by the wafer transferring robot 1. In the processing chamber 23, the wafer W is subjected to a processing step such as, e.g., film formation etching. Thus, each processing step is performed. After the final processing step, the wafer W will be carried out into the transferring chamber 21 by the wafer transferring robot 1, and then returned to the wafer cassette C in the cassette chamber 22. Thus, the wafer W will be subjected to series of processing steps in a predetermined atmosphere without being exposed to ambient air.

A conventional motor for driving robot arms of a wafer transferring robot to be driven in a vacuum environment of the aforementioned transferring chamber 21 is disclosed in Patent Documents, such as, e.g., U.S. Pat. Nos. 5,720,590 and 5,899,658. These Patent Documents disclose a motor for independently rotating two rotatable coaxial shafts connected to a plurality of robot arms by electromagnetic power. The aforementioned patent documents disclose two motor portions for driving two coaxial shafts. These two motor portions are disposed at different height positions about the center of the rotation axis.

The principal structural feature disclosed in these patent documents resides in that the rotor portion (the rotating portion of the motor to which magnets are attached) is located within the vacuum environment and that the electromagnetic generating stator portion (the non-rotating winding portion of the motor) is disposed in an atmospheric pressure environment. In detail, the rotor portion is encapsulated in a cylindrical portion of a cylindrical member (hereinafter referred to as a "can") made of a thin plate, and the magnets of the rotor portion are arranged so as to face to the inner peripheral surface of the can. Since the inside of this can communicates with the vacuum environment such as the transferring chamber 21 in which the robot is installed, it follows that the rotor portion, the aforementioned coaxial shafts connected to the rotor portion and the robot arms are disposed in the vacuum environment of the transferring chamber 21.

On the other hand, the stator portion is disposed outside the can such that the winding of the stator portion surrounds the magnets of the rotor portion via the can. Since the external portion of the can is exposed to an atmospheric pressure environment, the entire stator portion is disposed in an atmospheric pressure environment. The stator portion generates electromagnetic power via the thin can to rotate the rotor portion. This in turn causes a rotation of the shaft, i.e., the robot arm, to thereby cause a desired operation of the wafer transferring robot. Since the winding portion of the stator portion is disposed in an atmospheric pressure environment, dust generated from the stator portion will not be introduced into the vacuum environment. Furthermore, no gas will be generated from the stator portion and introduced into the vacuum environment, and therefore the pressure of the vacuum environment can be further reduced.

However, the aforementioned conventional motor for a vacuum robot has the following drawbacks.

(1) It can be expected to produce an effect that even if the stator portion generates dust, the dust will not be introduced into the inner portion of the robot and/or into the vacuum chamber. However, a force (which is approximately the same as atmospheric pressure) caused by the pressure difference between the atmospheric pressure environment and the vacuum chamber is kept applied to the can separating the atmospheric pressure environment and the vacuum chamber, and therefore it is necessary to prevent the deformation and/or the breakage of the can. As a result, it is naturally required to maintain the strength of the can by increasing the thickness of the material of the cylindrical member constituting the can. This results in an increased size of the can, which in turn results in an increased body size of the robot including the motor portion.

(2) In order to increase the electromagnetic power of the motor, it is very effective to decrease the distance (electromagnetic gap) between the winding of the stator and the magnet of the rotor portion. However, since the can is located between the winding and the magnet, the electromagnetic gap increases as the thickness of the can increases, resulting in extremely decreased electromagnetic power. As is well known, keeping the electromagnetic gap even and narrow has a great effect on the motor performance.

(3) Although the winding of the stator portion is disposed at the atmospheric side, since the winding is made of a metallic wire, it can be oxidized by the moisture contained in the atmosphere to be rusted and corroded due to the dusting or the dew condensation. This may develop to break the insulation layer of the winding, causing the short circuit, which in turn results in an inoperable wafer transferring robot.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments according to the present invention can provide a small, lightweight and highly-reliable work transferring robot capable of having a thin can material of a stator portion, decreasing an electromagnetic gap and preventing dusting and corrosion.

According to a first aspect of a preferred embodiment of the present, a vacuum robot comprising an arm portion on which a work is to be disposed under a reduced pressure environment, and a motor portion for rotatably driving the arm portion, the motor portion comprises:

a rotor portion connected to the arm portion, the rotor portion rotating together with the arm portion under the reduced pressure environment;

a stator portion disposed at an external periphery of the rotor portion, the stator portion rotating the rotor portion by electromagnetic force;

a housing disposed under an atmospheric pressure environment, the housing holding the stator portion on an internal periphery of the housing; and a thin cylindrical can disposed in an electromagnetic gap between the rotor portion and the stator portion and secured to the housing so that the stator portion is air-tightly encapsulated in a space formed by the housing and the can, wherein the space is maintained in a depressurized state by seal, and wherein the work is transferred by causing a rotational movement of the arm portion by the motor portion.

In some examples, in the vacuum robot, a plurality of motor portions can be disposed so that each rotor portion of the plurality of motor portions is rotated about a coaxial axis, and wherein each rotor portion of the plurality of motor portions is connected to the arm portion.

In some examples, in the vacuum robot, the housing can have at its external periphery an opening communicating with the space, and wherein the housing has at its external periphery an electric terminal to seal the opening and electrically connect a cable of a winding of the stator portion.

In some examples, in the vacuum robot, the housing can have at its external periphery a second opening communicating with the space, and wherein the housing has at its external periphery a sealing member for sealing the second opening.

In some examples, in the vacuum robot, the housing, or a member to be secured to the housing, can be connected to a guide member so that the motor portion and the arm portion move up and down by an elevating axial portion provided at a lower portion of the motor portion while being vertically guided by the guide member.

According to a second aspect of a preferred embodiment of the present, a work processing apparatus, comprising:

a processing chamber for processing a work under a depressurized environment;

a transferring chamber connected to the processing chamber via an openable and closable opening, pressure of the transferring chamber being maintained approximately to pressure of the depressurized environment;

a cassette chamber connected to the transferring chamber, the cassette chamber being configured to accommodate the work and being repeatedly changed in pressure between approximately the pressure of the depressurized environment and approximately the environmental pressure; and a vacuum robot disposed in the transferring chamber, the vacuum robot being configured to transfer the work between the cassette chamber and the transferring chamber, wherein the vacuum robot is constituted by the vacuum robot.

According to a third aspect of a preferred embodiment of the present, a method of manufacturing a vacuum motor comprising a rotor portion disposed in a depressurized environment and configured to be rotated, a stator portion disposed at an external peripheral side of the rotor portion and configured to rotate the rotor portion by electromagnetic force, a housing disposed in an atmospheric pressure environment and configured to hold the stator portion on an internal periphery thereof, a thin cylindrical can disposed in an electromagnetic gap formed between the rotor portion and the stator portion and secured to the housing so that the stator portion is air-tightly encapsulated in a space formed by the housing and the can, an opening communicating with the space, and a sealing member for sealing the opening, the method comprising:

securing the stator portion to the housing;

fixing the can to the housing so as to encapsulate and seal the stator portion;

provisionally securing the sealing member near the opening without completely sealing the opening;

encapsulating members including the housing, the can, the stator portion and the sealing member in a vacuum chamber;

depressurizing the space to a desired pressure while depressurizing the vacuum chamber; and sealing the opening with the sealing member when the vacuum chamber is opened to approximately atmospheric pressure, whereby the space is kept at the desired pressure.

According to a fourth aspect of a preferred embodiment of the present, a vacuum robot manufactured by the manufacturing method, wherein the rotor portion of the vacuum robot is connected to the robot arm for transferring the work with the work disposed thereon by rotating the robot arm.

According to the preferred embodiment of the present invention, the following effects can be obtained.

(1) The space in which the stator portion exists nearly maintains the initial vacuum status created when the motor was produced, and the pressure difference between the pressure of the space and the pressure of the rotor portion in the can (chamber space such as a transferring chamber in which the rotor portion or the robot arm is used) is small. Thus, the pressure to be applied to the can 16 can be reduced, which makes it possible to reduce the thickness of the can. As a result, the body diameter of the robot can be decreased.

(2) When it becomes possible to reduce the thickness of the can and reduce the electromagnetic gap, it can be expected to increase the electromagnetic power, which in turn can reduce the size and the weight of the motor portion. Accordingly, the body diameter of the robot can be reduced.

(3) Since the space of the stator portion is in a vacuum state, the winding of the stator portion is hard to oxidize thus preventing a possible short circuit due to the dusting and/or the dew concentration, which in turn can enhance the reliability of the motor and robot.

(4) If the molding resin hardener for molding the winding of the stator portion (embedding the winding in a resin hardener for insulation) is disposed in a vacuum space, gases will be generated from the hardener to increase the pressure of the vacuum environment. However, since the stator portion is isolated from the space for the rotor portion and the robot arm by the can, no gas generation will occur, resulting in no effect on the vacuum pressure.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
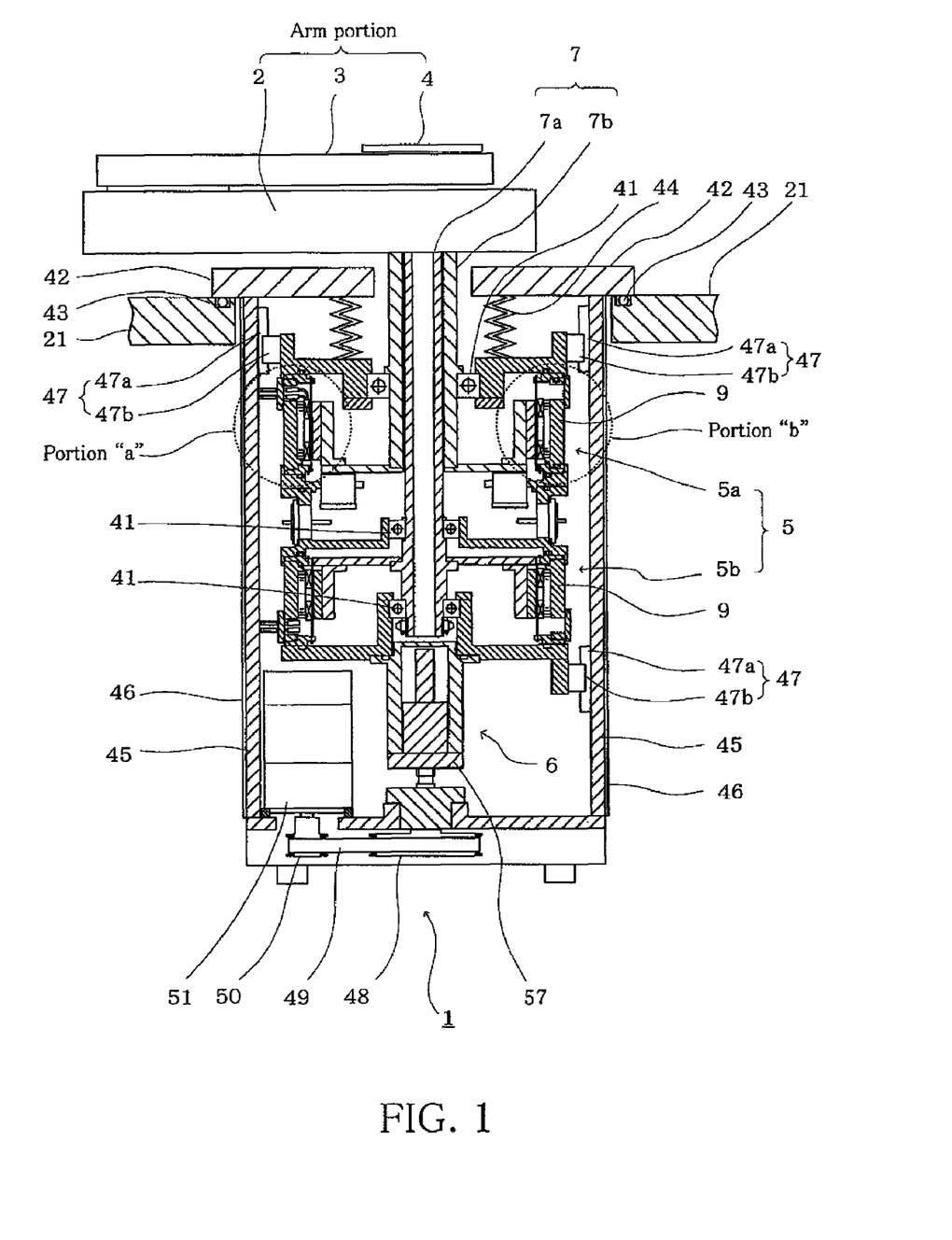
FIG. 1 is a side cross-sectional view of a vacuum robot according to an embodiment of the present invention.
Figure 2:
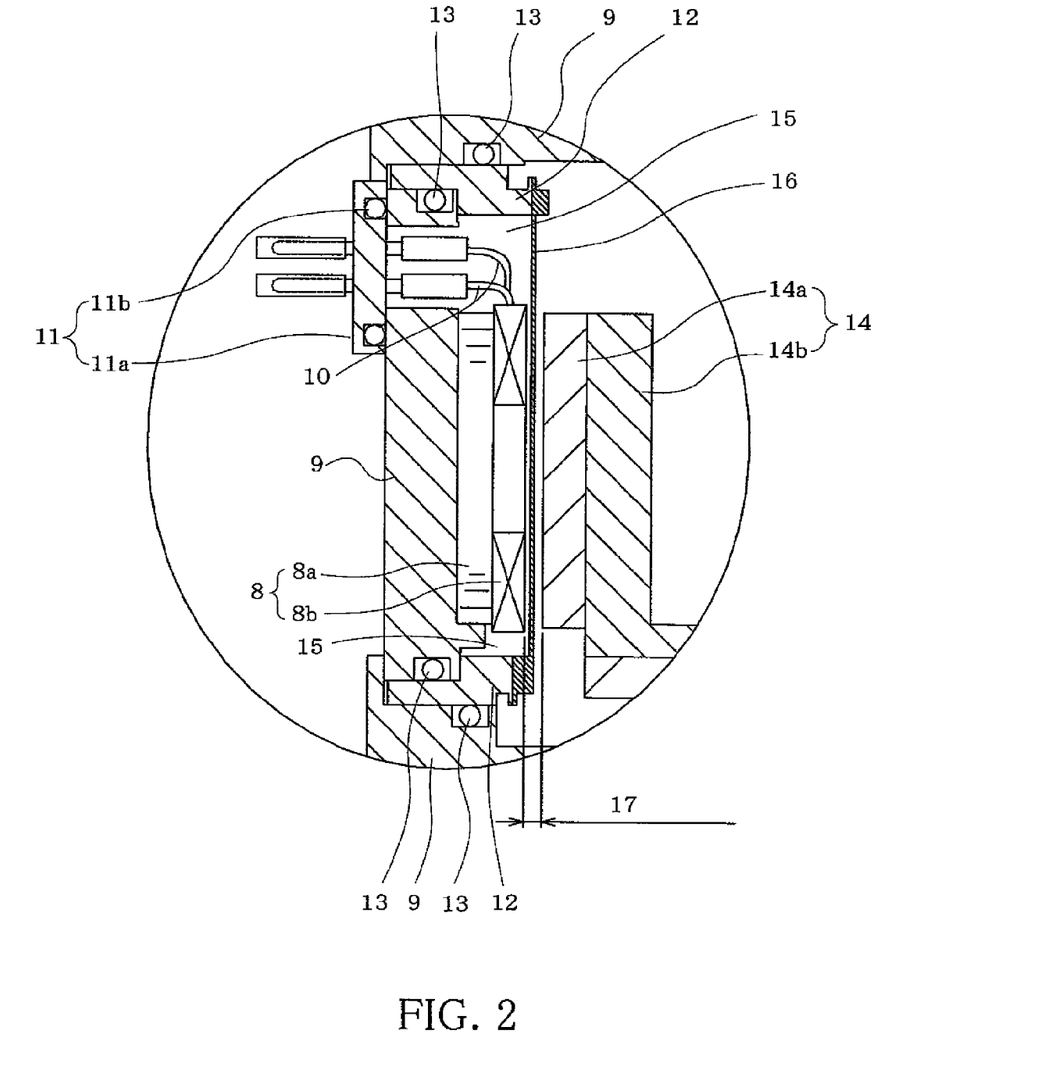
FIG. 2 is an enlarged view showing the principal portion "a" shown in FIG. 1.
Figure 3:
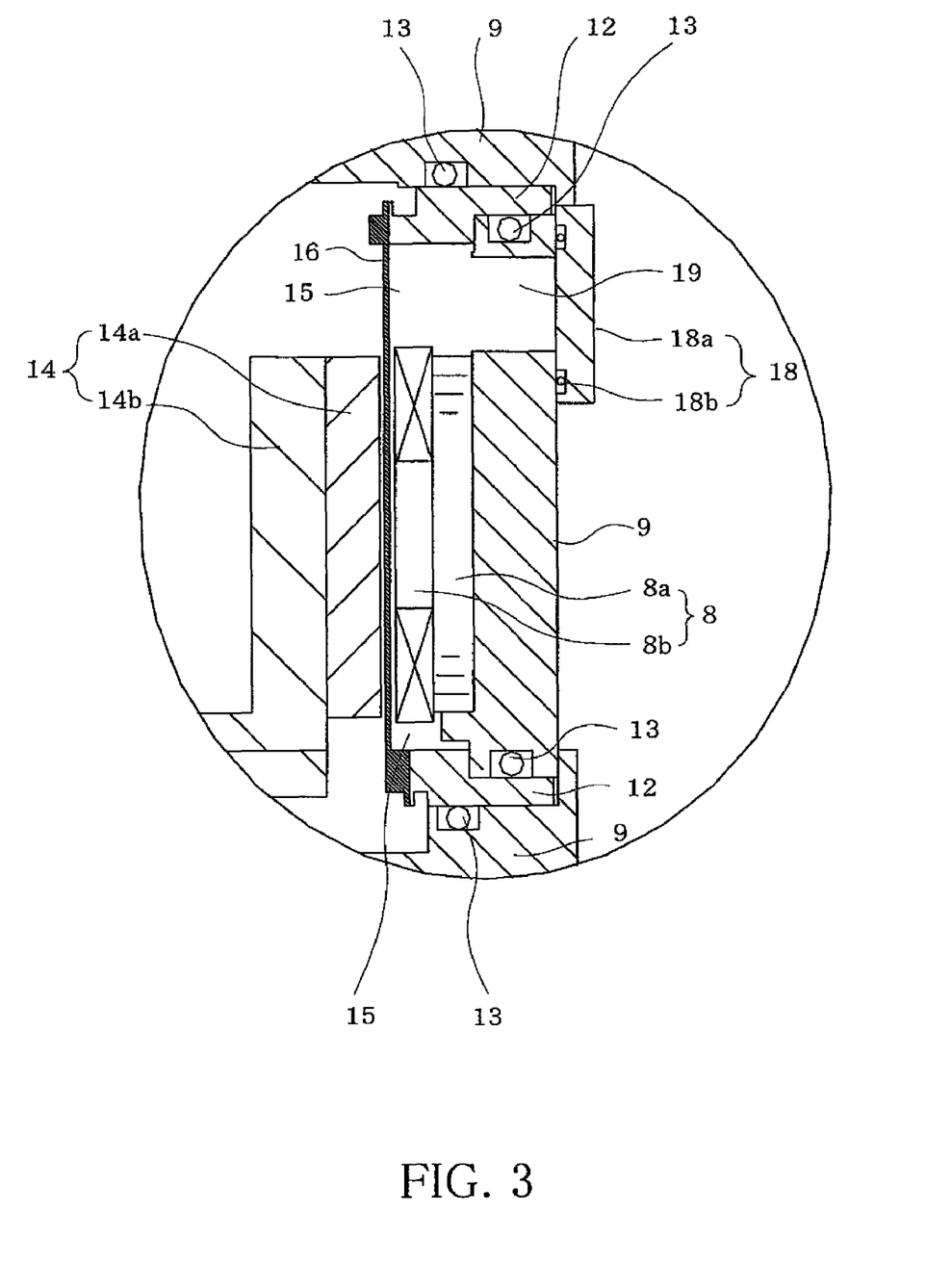
FIG. 3 is an enlarged view showing the principal portion "b" shown in FIG. 1.

An embodiment of the present invention will be explained with reference to the attached drawings. FIG. 1 is a side cross-sectional view of a vacuum robot showing an embodiment of the present invention. FIGS. 2 and 3 each shows an enlarged view of the principal portion (portion "a" and "b") shown in FIG. 1.

In FIG. 1, the reference numeral "1" denotes a work transferring robot which is the same as the wafer transferring robot 1 shown in FIG. 5. The same reference numeral is allotted to the corresponding portion. The work transferring robot 1 generally includes an arm portion including robot arms 2 and 3 and a hand 4, and a motor portion 5 for rotatably driving the arm portion. The motor portion 5 includes motor portions 5a and 5b each having approximately the same structure and coaxially arranged one above the other. The robot 1 has an elevating axial portion 6 for lifting and lowering the entirety of the arm portion and the motor portion 5.

In each portion of the arm portion, a rotational movement and an expansion and contraction movement can be realized by a first motor portion 5a and a second motor portion 5b. On the hand 4, a wafer W is to be disposed as explained above. Below the arm portion, a flange 42 is fixed to the inner bottom surface of the transferring chamber 21. Provided between the flange 42 and the bottom surface of the transferring chamber 21 is an O-ring 43. This O-ring 43 is a ring-shaped fluorine resin rubber member which keeps the air-tightness with respect to the outside of the transferring chamber 21. A shaft 7 supporting the arm portion is protruded through the flange 42. Around the shaft 7, a bellows 44 expandable up and down as seen in FIG. 1 is provided. The upper surface of the bellows 44 is air-tightly connected to the lower surface of the flange 42. From the lower surface of the flange 42, a plurality of pillars 45 are extended. A cover 46 constituting a robot outer panel is disposed so as to surround the pillars 45 and fixed to the outer surfaces of the pillars 45. Along the inner surface of the pillar 45, a plurality of linear guides 47 are provided. The linear guide 47 includes a rail 47a and a slider 47b. A plurality of sliders 47b are movably guided along the rails 47a in the up-and-down direction of FIG. 1.

The lower portion of the bellows 44 is air-tightly connected to a member connected to the housing 9 of the motor portion 5 which will be explained later. To the two motor portions 5a and 5b, as explained above, the housings 9 are connected coaxially. From the upper surface of the housing 9, the aforementioned shaft 7 is protruded. The shaft 7 consists of an inner shaft 7a and an outer shaft 7b. The outer shaft 7b is a hollow member in which the inner shaft 7a is disposed. These shafts 7a and 7b do not interfere with each other. These shafts 7a and 7b are coaxially arranged and rotatably supported with bearings 41 with respect to the housing 9.

On the other hand, each external peripheral portion of the housing 9 is connected to the aforementioned slider 47b. Thus, the motor portion 5 is movable in the up-and-down direction by the linear guide 47. At the lowermost portion of the motor portion 5, a known ball screw 57 is provided. To the rotary portion of the ball screw 57, a pulley 48 is attached. A belt 49 is put on the pulley 48 and another pulley 50, so that the pulley 50 can be rotated with a motor 51. Thus, in accordance with the rotational movement of the motor 51, the motor portions 5a and 5b and the arm portion move in the up-and-down direction. The aforementioned members form an elevating axial portion 6.

The motor portion 5 will be overviewed with reference to FIGS. 2 and 3. The motor portion 5 is constituted by the first motor portion 5a positioned at a load side and the second motor portion 5b positioned at a side opposite to the load side. The first motor 5a and the second motor 5b are substantially the same in structure. Therefore, the following explanation can be applied to both the motor portions 5a and 5b.

The rotor portion 14 is comprised of a cylindrical member 14b and a permanent magnet 14a fixed to the external periphery of the cylindrical member 14b with an adhesive agent or the like. The cylindrical member 14b is connected to the shaft 7a or 7b. In this embodiment, the shaft 7a and the rotor portion 14 of the second motor 5b are connected each other, and the shaft 7b and the rotor portion 14 of the first motor 5a are connected each other.

The stator portion 8 is formed into a cylindrical shape and includes the winding 8b which generates magnetic fields as current passes therethrough and a core 8a which is a member for enhancing the magnetic fields. The core 8a is closely disposed to the permanent magnet 14a so as to face the permanent magnet 14a.

With this structure, the shaft 7a and the shaft 7b are coaxially rotated by the second motor 5b and the first motor 5a, respectively. The structure of the motor portion 5 is generally known.

The motor portion 5 will be described more detail. In FIG. 2, on the external periphery of the stator portion 8 (the winding 8b and the core 8a), a housing 9 for fixedly holding the core 8a and the winding 8b is provided. A can 16 for enclosing the space in which the stator portion 8 exists together with the housing 9 is provided. As illustrated, the can 16 is positioned in the magnetic gap 17 formed between the rotor portion 14 and the stator portion 8. The can 16 is a cylindrically formed member made of a stainless steel thin plate. Above and below the housing 9, a fixing member 12 made of the same material as the can 16 is provided for fixing the can 16 to the housing 9 by welding. Between the housing 9 and the fixing member 12, an O-ring 13 is disposed. The can 16 is fixed to these fixing members 12 and 12 by welding. Accordingly, in the air-tight space 15 surrounded by the housing 9, the two fixing members 12 and 12 and the can 16, the stator 9 is disposed.

At the external periphery of the housing 9, as shown in FIG. 3, a vacuuming opening 19 communicated with the space 15, a sealing member 18a, and an O-ring 18b for enhancing the air-tightness of the sealing member 18a are provided. Furthermore, at the external periphery of the housing 9, as shown in FIG. 2, an electric terminal 11a as a cable terminal for drawing the cables 10 to the outside of the housing 9 for introducing current to the winding 8b, and an O-ring 11b for enhancing the air-tightness of the electric terminal 11a are provided. The sealing member 18a and the electric terminal 11a are fixed to the housing 9 by screws (not illustrated) in an air-tightly sealed manner using O-rings 11b and 18b.

In the aforementioned motor portion 5, it is required to design the electromagnetic gap 17 to be small (narrow). When the vacuum robot 1 is disposed in a vacuumed chamber, such as the transferring chamber 21 shown in FIG. 5, the cylindrical inner portion of the can 16 is in a vacuum state, while the cylindrical external portion is in an atmospheric pressure environment. As a result, a pressure difference is generated between the inner side of the can 16 and the outer side thereof. Thus, force corresponding to the atmospheric pressure is applied to the can 16. As a material of the can 16, a thin material is preferably used to narrow the electromagnetic gap 17 to be as small as possible. However, it is more important to maintain the strength of the can 16 by using a material which will not be deformed by the force of the atmospheric pressure. Accordingly, in this embodiment, the force to be applied to the can 16 is decreased by forming the space 15 which air-tightly encapsulates the stator portion 8, at the external peripheral side of the can 16 and maintaining this space 15 in a depressurized state.

Now, the method of sealing the space 15 in a vacuum state will be explained. A pump is connected to the vacuuming opening 19 to depressurize the space 15, the inner gas in the space 15 is discharged through the vacuuming opening 19 with the pump, and then the vacuum opening 19 is quickly sealed after detaching the pump from the vacuum opening 19. With this method, the space 15 can be held at a certain vacuum level. However, even at the moment of detaching the pump from the vacuum opening 19, a large amount of external gas will be introduced into the space 15 through the connecting portion, which makes it difficult to maintain the inner pressure of the space 15 under a desired pressure. Furthermore, the above operation requires skills and quickness, and it is impossible to hold the space 15 under a stable pressure every operation (for every robot).

Figure 4:
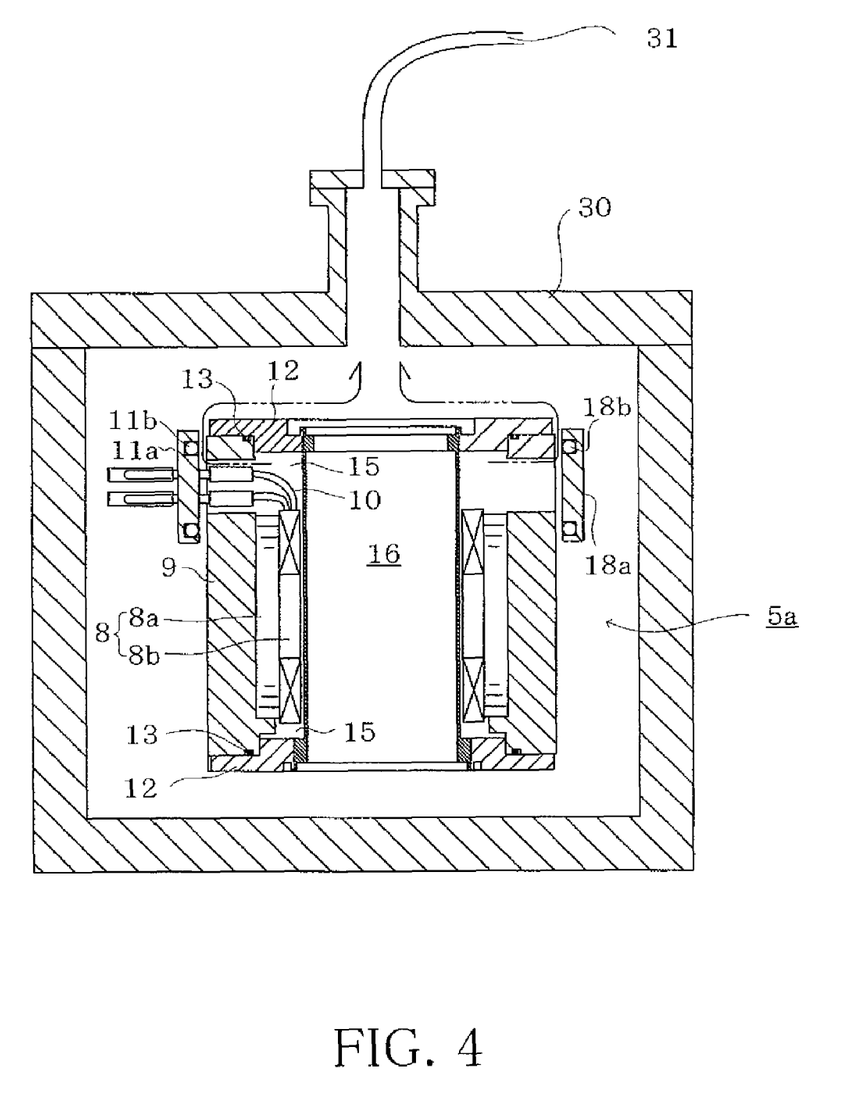
FIG. 4 is a cross-sectional view showing an apparatus for sealing the space of the stator in a vacuum state.

Accordingly, in this embodiment, the space 15 is sealed to keep the vacuum state by the following method. The method will be explained with reference to FIGS. 2 to 4. FIG. 4 is a cross-sectional view showing an apparatus for sealing the space 15 in a vacuum state.

At the assembling stage of the first motor portion 5a before completing the robot as shown in FIG. 1, the cylindrical winding 8b and core 8a are molded to the housing 9. The molded portion is not illustrated.

Next, the fixing member 12 is fixed to the housing 9 with the O-ring 13 disposed therebetween.

Then, the can 16 is welded to the fixing members 12 in an air-tight manner.

Next, the cables 10 from the winding 8b are electrically connected to the electric terminal 11a and the electric terminal 11a is secured to the housing 9 via the O-ring 11b.

Then, the sealing member 18a is provisionally secured to the housing 9 via the O-ring 18b. "Provisionally securing" denotes that the sealing member 18a is secured without completely tightening screws (not illustrated) so that the O-ring 18b is not substantially deformed (i.e., in a state in which the space 15 is not sealed in an air-tight manner).

The first motor portion 5a and so on fabricated by the aforementioned method is disposed in a vacuum chamber (container) 30. In this state, the vacuum chamber 30 is airtightly sealed and then the inner gas is discharged through the outlet 31 of the vacuum chamber 30. At this time, since the O-ring 18b is not deformed, the inner gas contained in the space 15 where the stator portion 8 exists is discharged through the gap around the O-ring 18b in the same manner as in another space of the vacuum chamber 30.

After the vacuum chamber 30 has reached a desired pressure or below, for example, the outlet 31 is opened to return the vacuum chamber 30 to an atmospheric state. At this moment, although atmospheric pressure will be applied to the aforementioned first motor portion 5a, since the space 15 of the stator portion 8 is in a vacuumed state, the sealing member 18 will be pressed against the housing 9 by the atmospheric pressure because of the pressure difference. At the same time, the sealing member 18a causes complete deformation of the O-ring 18b to completely seal the space 15 of the stator portion 8 in a vacuum state.

Finally, the sealing member 18a is completely secured to the housing 9 by screws (not illustrated).

Thereafter, the first motor portion 5a in which the space 15 is in a vacuum state, the second motor portion 5b assembled in the same manner, the arm portion, the elevating axial portion 6, etc., are assembled to complete a vacuum robot. Needless to say, the aforementioned method can be performed in a vacuum chamber 30 capable of accommodating a vacuum robot even if the vacuum robot is in a substantially assembled state.

As mentioned above, the inner pressure of the space 15 is made in a vacuum state at the robot production stage and maintained, thus the space 15 does not need to be constantly discharged with a pump or the like, as with in the space of the transferring chamber 21 and that of the can 16. Accordingly, at the actual usage stage of the robot, the inner portion of the transferring chamber 21 and that of the can 16 are kept low in pressure by an operation of a pump, and therefore the space 15 is assuredly maintained in a state in which the pressure is lower than the pressure of the atmospheric space outside the housing 9, although the pressure may be higher than the inner pressure of the transferring chamber 21 or that of the can 16. As a result, the pressure difference between the inside of the can 16 and the outside thereof will be decreased, resulting in decreased deformation of the can 16 due to the pressure difference. This enables the use of a thinner material of the can 16. This in turn enables an employment of a narrower electromagnetic gap 174 resulting in increased power of the motor portion 5. Furthermore, it becomes possible to avoid a problem that the can 16 expands toward the rotor portion side due to the deformation of the can 16 to cause contact with the rotor portion 14.

In the aforementioned embodiment, although the sealing member 18a and the O-ring 18b are provided separately from the electric terminal 11a, and the O-ring 11b, the electric terminal 11a and the O-ring 11b can be used to play the same role as the sealing member 18 to form the vacuum state of the space 15. In this case, the sealing member 18 can be eliminated.

The O-ring 18b is preferably an elastic member of, e.g., fluorine resin, but can be a metallic sealing ring.

The above embodiment is directed to the case in which the arm portion is driven by a total of two motors, the first motor portion 5a and the second motor portion 5b. However, it should be understood that the number of motor portions is not limited in the preset invention.

In the above embodiment, the space in which the arm portion and the rotor portion 14 exist (i.e., the inner space of the transferring chamber 21 to be kept in a vacuumed state) and the space 15 are isolated by the can 16. Therefore, dust generated from the stator portion 8 will not be introduced into the inside of the transferring chamber 21, and the pressure of the transferring chamber 21 will not be influenced by the gases generated from, e.g., the mold member of the stator portion 8.

Furthermore, since the space 15 in which the stator portion 8 exists is maintained in a vacuumed and sealed state, the winding 8b of the stator portion 8 is never corroded by the atmospheric water contents.

Furthermore, although the space 15 is higher in pressure than the transferring chamber 21 and the inner space of the can 16, since the pressure of the space 15 is maintained to be sufficiently lower than the atmospheric space outside the housing 9, the pressure to be applied to the can 16 by the pressure difference can be reduced. As a result, since the can 16 can be made of sufficiently thin material, the body diameter of the robot can be decreased and the electromagnetic force of the motor portion 5 can be increased since the electromagnetic gap can be narrowed.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is nonexclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A vacuum robot comprising:
   an arm portion on which a work is disposed in a reduced pressure environment, and
   a motor portion rotatably driving the arm portion, the motor portion comprising:
   a rotor portion connected to the arm portion, the rotor portion rotating together with the arm portion in the reduced pressure environment;
   a stator portion disposed at an external periphery of the rotor portion, the stator portion rotating the rotor portion by electromagnetic force in an environment closer to atmospheric pressure than the reduced pressure environment;
   a housing, an exterior of the housing disposed in an atmospheric pressure environment, the housing holding the stator portion on an internal periphery of the housing; and
   a thin cylindrical can disposed in an electromagnetic gap formed between the rotor portion and the stator portion and secured to the housing so that the stator portion is air-tightly encapsulated in a space formed by the housing and the can,
   wherein the reduced pressure environment has a lower pressure than the environment closer to atmospheric pressure and the environment closer to atmospheric pressure has a lower pressure than the atmospheric pressure environment, and
   wherein the space is maintained in a depressurized state by seal, and wherein the work is transferred by causing a rotational movement of the arm portion by the motor portion;
   wherein the housing has at its external periphery an opening communicating with the space, and wherein the housing has at its external periphery an electric terminal configured to seal the opening and electrically connect a cable of a winding of the stator portion.

2. The vacuum robot as recited in claim 1, wherein a plurality of motor portions are disposed so that each rotor portion of the plurality of motor portions is rotated about a coaxial axis, and wherein each rotor portion of the plurality of motor portions is connected to the arm portion.

3. The vacuum robot as recited in claim 1, wherein the housing has at its external periphery a second opening communicating with the space, and wherein the housing has at its external periphery a sealing member for sealing the second opening.

4. The vacuum robot as recited in claim 1, wherein the housing, or a member to be secured to the housing, is connected to a guide member so that the motor portion and the arm portion move up and down by an elevating axial portion provided at a lower portion of the motor portion while being vertically guided by the guide member.

* * * * *